US 6,642,092 B1

(12) United States Patent
Voutsas et al.

(10) Patent No.: US 6,642,092 B1
(45) Date of Patent: Nov. 4, 2003

(54) THIN-FILM TRANSISTORS FORMED ON A METAL FOIL SUBSTRATE

(75) Inventors: Apostolos T. Voutsas, Vancouver, WA (US); John W. Hartzell, Camas, WA (US); Masahiro Adachi, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/194,895

(22) Filed: Jul. 11, 2002

(51) Int. Cl.[7] .............................................. H01L 21/00
(52) U.S. Cl. ........................ 438/166; 438/164; 438/780
(58) Field of Search .................... 438/166, 164, 438/74, 72, 73, 97, 455, 457, 459, 609, 780, 22, 99, 597, 956, 66; 257/40, 59, 72, 99; 313/503, 504

(56) References Cited

U.S. PATENT DOCUMENTS

| 5,476,810 A | * | 12/1995 | Curran ........................ 438/164 |
| 6,150,668 A | * | 11/2000 | Bao et al. ...................... 257/40 |
| 6,184,057 B1 | * | 2/2001 | Van Andel et al. ............ 438/66 |
| 6,433,841 B1 | * | 8/2002 | Murade et al. ................ 349/43 |
| 6,437,422 B1 | * | 8/2002 | Solomon et al. ............. 257/618 |
| 6,440,877 B1 | * | 8/2002 | Yamazaki et al. ........... 438/780 |

OTHER PUBLICATIONS

Theiss et al "Amorphous Silicon Thin–Film Transistors on Steep Foil Substrates", IEEE Electron Device Letters, vol. 17, No. 12, Dec. 1996.*

Wu et al "Integration of Organic LED's and Amorphous Si TFT's Onto Flexible and Lightweight Metal Foil Substrates", IEEE Electron Device Letters, vol. 18, No. 12, Dec. 1997.*

T. Serikawa and F. Omata, IEEE Electron Dev. Lett., 20, 574 (1999).

M. Wu and S. Wagner, Mat. Res. Soc. Symp. Proc., 2001.

* cited by examiner

Primary Examiner—Carl Whitehead, Jr.
Assistant Examiner—Laura Schillinger
(74) Attorney, Agent, or Firm—David C. Ripma; Matthew D. Rabdau; Scott C. Krieger

(57) ABSTRACT

A method for is provided forming a thin-film transistor (TFT) on a flexible substrate. The method comprises: supplying a metal foil substrate such as titanium (Ti), Inconel alloy, stainless steel, or Kovar, having a thickness in the range of 10 to 500 microns; depositing and annealing amorphous silicon to form polycrystalline silicon; and, thermally growing a gate insulation film overlying the polycrystalline. The silicon annealing process can be conducted at a temperature greater than 700 degrees C. using a solid-phase crystallization (SPC) annealing process. Thermally growing a gate insulation film includes: forming a polycrystalline silicon layer having a thickness in the range of 10 to 100 nanometers (nm); and, thermally oxidizing the film at temperature in the range of 900 to 1150 degrees for a period of time in the range of 2 to 60 minutes. Alternately, a plasma oxide layer is deposited over a thinner thermally oxidized layer.

39 Claims, 2 Drawing Sheets ively oxidized SiO2 films are of very high quality, in terms of bulk and interface properties. This reasoning is also related to the index of refraction of the oxide.

THIN-FILM TRANSISTORS FORMED ON A METAL FOIL SUBSTRATE

BACKGROUND OF THE INVENTION

1. Field of the Invention

This invention generally relates to integrated circuit (IC) and liquid crystal display (LCD fabrication and, more particularly, to thin-film transistors (TFTs) formed on a metal foil substrate and a process for forming the same.

2. Description of the Related Art

High quality polycrystalline silicon material is the building block of high performance TFTs that are used in integrated circuits and microelectronic devices such as LCDs. The higher the quality of the poly-Si material, that is, the closer to single-crystal Si material, the better the performance of the resultant devices. Therefore, it is desirable to develop methods that yield high quality polysilicon (poly-Si) material for display or other electronic products.

The performance of the device is affected not only by the crystalline quality of the active layer, but also by the quality of the gate insulator film that covers the active layer. Both the bulk properties of the gate insulator, as well as the properties of the interface that forms between the gate insulator and the poly-Si layer, are very important for the operation of the device. For Si or poly-Si devices, the best gate insulator film is SiO2, and the best method of forming a high quality SiO2 film with excellent bulk and interface properties is by thermal oxidation.

A silicon substrate has a sufficiently high melting point to withstand thermal treatments up to temperatures in the range of 1200° C. Thus, thermal oxidation at 900–1150° C. is possible on silicon wafers. When the substrate, however, is made of glass or plastic, as is typically the case for LCDs and/or flexible/conformable microsystems, the maximum process temperature window is restricted to much lower temperatures.

The use of alternative substrate materials is of interest, as it would enable the realization of new products that are not otherwise feasible to make. One particular aspect of interest is flexibility, the ability of the microsystem to bend, conform, or maintain its integrity under external "stress". These attributes would enable the manufacturing of a variety of one-use products and/or the manufacturing of robust products that maintain their functionality under a wide range of external, "environmental" conditions. Therefore, there is motivation to develop microsystems, such as displays with electronics, sensors, or other products that combine TFT microelectronic devices, that are robust, have high performance, and are cheap to make.

Very high performance transistors can be made on various substrates using laser annealing technology. However, this technique is typically much more expensive than solid-phase-crystallization (SPC). The latter, however, lacks the performance of laser annealing, as the annealing temperatures must be restricted when glass substrates are used.

It would, therefore, be advantageous if a technology were available that could utilize solid-phase crystallization, but offer the performance levels of laser annealing in the fabrication of TFTs.

It would be advantageous if the above-mentioned high-performance TFTs could be fabricated on a flexible substrate for use in flexible Microsystems.

SUMMARY OF THE INVENTION

The present invention describes a technology that enables the fabrication of high performance devices for flexible microsystem applications, using a standard, low cost poly-Si TFT process flow. One aspect of the invention is the combination of high temperature thermal oxidation with solid-phase-crystallized poly-Si material. Thermal oxidation requires temperatures in the range of 900–1150° C., which is not compatible with conventional flexible substrates. This problem is solved in the present invention by utilizing flexible thin metal foils as the starting substrate. Thin metal foils can withstand temperatures in excess of 1000° C. if certain treatments are applied the initial metal foil material.

Accordingly, a method for is provided forming a thin-film transistor (TFT) on a flexible substrate. The method comprises: supplying a metal foil substrate such as titanium (Ti), Inconel alloy, stainless steel, or Kovar, having a thickness in the range of 10 to 500 microns; depositing amorphous silicon; annealing the amorphous silicon to form polycrystalline silicon; and, thermally growing a gate insulation film overlying the polycrystalline film.

The amorphous silicon annealing process can be conducted at a temperature greater than 700 degrees C. using a solid-phase crystallization (SPC) annealing process. Thermally growing a gate insulation film includes: forming a first film polycrystalline silicon layer having a thickness in the range of 10 to 100 nanometers (nm); and, thermally oxidizing the first film layer at temperature in the range of 900 to 1150 degrees C. for a period of time in the range of 2 to 60 minutes.

Alternately, thermally growing a gate insulation film further includes plasma depositing a second layer of oxide overlying the first film. Then, the first film has a thickness in the range of 10 to 50 nm and the second layer of oxide overlying the first film has a thickness in the range of 40 to 100 nm.

Additional details of the above-described method, and a thin-film transistor on a flexible substrate are provided below.

DETAILED DESCRIPTION OF THE PREFERRED EMBODIMENTS

Figure 1:
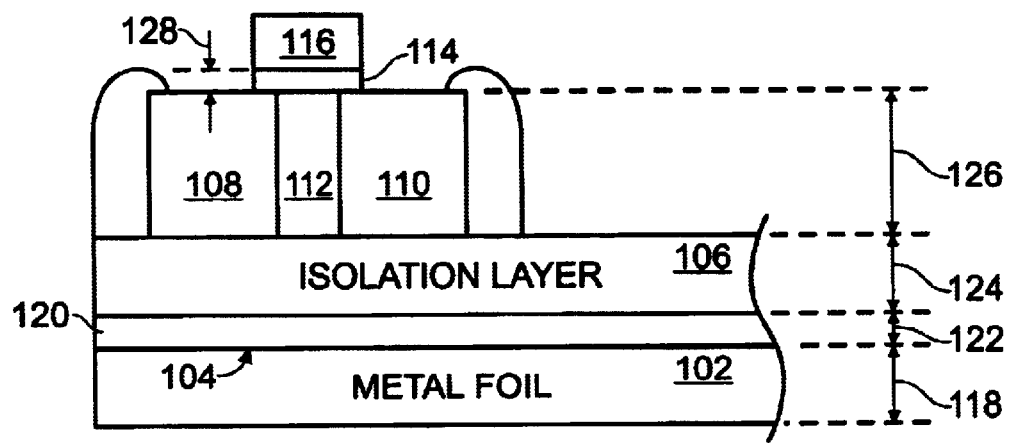
FIG. 1 is a partial cross-sectional view of the present invention thin-film transistor (TFT) on a flexible substrate.

FIG. 1 is a partial cross-sectional view of the present invention thin-film transistor (TFT) on a flexible substrate. The TFT 100 comprises a metal foil substrate 102 with a surface 104. In some aspects, the metal foil substrate 102 is a material such as titanium (Ti), Inconel alloy, stainless steel (304 SS), or Kovar. An electrical isolation layer 106 overlies the metal foil substrate surface. Drain 108, source 110, and channel 112 regions are formed from polycrystalline silicon 113 overlying the electrical isolation layer 106. The TFT fabrication process is a silicon on insulator. (SOI) process, in that active layer polysilicon islands are formed on an insulation layer. A gate insulation oxide film 114 overlies the polycrystalline silicon having an index of refraction in the range of 1.4 to 1.6. A gate 116 overlies the gate insulation oxide layer 114.

A gate insulation oxide layer 114 that can be thermally oxidized permits TFT performance enhancements. Thermal oxidation annihilates structural defects that would otherwise impede carrier conduction. Further, thermally oxidized, or thermally grown gate insulation material permits the threshold voltage of the TFTs to be more accurately controlled. However, it is difficult to clearly differentiate thermally grown oxide from other forms of oxide, such as plasma deposited TEOS oxide. One measure of differentiation is the index of refraction. Perfect thermal oxide will have an index of refraction of 1.46. However, process variations do not always permit a perfect thermal oxide to be grown. Therefore, it is recognized that a thermal oxide having an index of refraction between 1.4 and 1.6 is sufficient for many aspects of the present invention.

In some aspects, the metal foil substrate 102 has a thickness 118 in the range of 10 to 500 microns. More preferably, the metal foil substrate 102 has a thickness 118 in the range of 50 to 250 microns. Most preferably, the metal foil substrate 102 has a thickness 118 in the range of 100 to 200 microns. A thinner metal foil substrate is preferable. A thickness of less than 200 microns generally insures conformability, but a very flexible substrate would have a thickness of 150 microns, or less. Reduced weight is another advantage to thinner substrates.

The metal foil substrate surface 104 has an average surface roughness (not shown) of less than approximately 200 nanometers (nm). This surface roughness is accomplished by one of two different processes. In the first process, a spin-coat dielectric material 120 is deposited to overlie the electrical isolation layer 106, having a thickness 122 in the range of 200 to 500 nm. In some aspects, the spin-coat dielectric material 120 is a spin-on-glass (SOG) material. Alternately, the surface roughness specification is achieved using a chemical-mechanical polishing (CMP) process. When CMP is used, the spin-coat dielectric material 120 need not be used.

The electrical isolation layer 106 is a material such as SiO2, SiNx, or SiON. The electrical isolation layer 106 has a thickness 124 in the range of 0.5 to 2 microns. Preferably, the thickness 124 is in the range of 0.5 to 1.5 microns. Most preferably, the thickness 124 is in the range of 0.5 to 1 microns. Thinner isolation layers increase throughput and also reducing the stress on the substrate. Typically the stress is balanced with deposition on both sides of the substrate. Hence, it is doubly desirable to reduce the thickness of the electrical isolation layer. However, if the isolation layer is too thin, insufficient isolation is provided, increasing parasitic coupling (parasitic capacitance) between the substrate and the TFT plane 113. The electrical isolation layer can also provide, to some extent, protection against the diffusion of impurities from the metal substrate. That is, the electrical isolation layer can act as a diffusion barrier. Therefore, the thickness needs to be optimized from both these points of usage.

The polycrystalline silicon 113 has a thickness 126 in the range of 25 to 150 nm. Preferably, the polycrystalline silicon 113 has a thickness 126 in the range of 25 to 100 nm. Most preferably, the thickness 126 is in the range of 35 to 60 nm.

The poly-Si thickness drives certain TFT characteristics. Thicker films have better microstructure, for example a larger grain size, that typically provides for higher mobility and ON current. However, thicker film TFTs demonstrate higher OFF (leakage) current. Therefore, thinner films are preferable for applications where the OFF current needs to be low. Generally, pixel TFTs require a low OFF current. TFTs made from thermally grown dielectrics can have both advantages. Thermally "grown" SiO2 film consumes part of the poly-Si during its growth. Therefore, one can start with a thicker poly-Si film, to obtain the advantage of microstructure, and then "thin" it down during the growth of the dielectric to obtain the low leakage current. The SiO2 film typically consumes poly-Si thickness equivalent to ~54% of the dielectric thickness. In other words, if a 500 Å of thermal SiO2 were grown, ~250 Å of poly-Si film would be consumed. Thus, to have 500 Å of poly-Si film remaining, over 750 Å of poly-Si film would be needed before thermal oxidation. If 1000 Å of thermal SiO2 were grown, the initial poly-Si thickness would have to be even larger (~1000Å) to be left with 500 Å of poly-Si film at the end.

Overall, the gate insulation oxide film 114 has a thickness 128 in the range of 10 to 100 nm. In one aspect, the gate insulation film 114 is formed exclusively from thermally grown SiO2. However, the gate insulation film 114 can also be formed in layers to reduce the process time.

Figure 2:
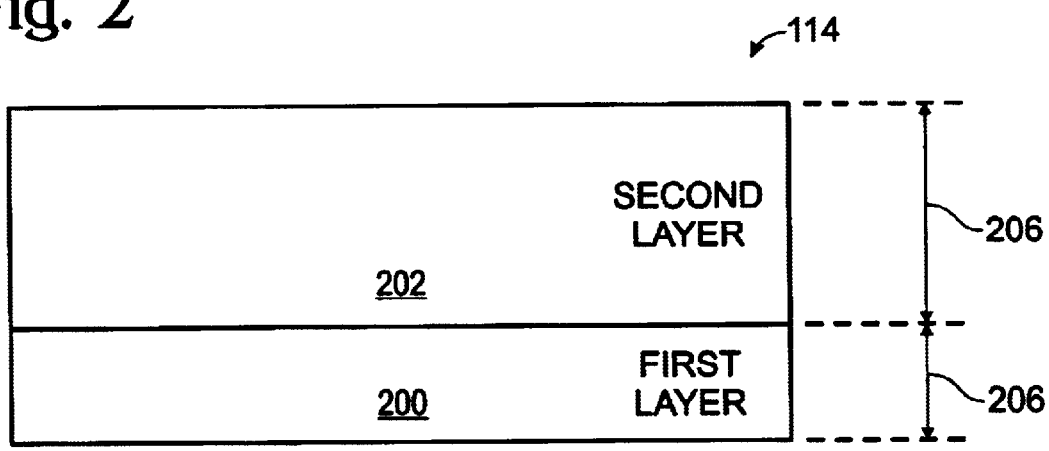
FIG. 2 is a detailed depiction of the gate insulation oxide film of FIG. 1.

FIG. 2 is a detailed depiction of the gate insulation oxide film 114 of FIG. 1. Gate insulation oxide film 114 includes a first oxide film layer 200 having an index of refraction in the range of 1.4 to 1.6. The first oxide film layer 200 is thermally grown. The gate insulation oxide film 114 further includes a second oxide film layer 202 overlying the first oxide layer 200 having an index of refraction in the range of 1.4 to 2.0. In some aspects, the second oxide film 202 is formed by plasma deposition.

The first oxide film layer 200 has a thickness 204 in the range of 20 to 30 nm. The second oxide film layer 202 has a thickness 206 in the range of 40 to 100 nm. Preferably, the second oxide film layer 202 has a thickness 206 in the range of 50 to 70 nm. Typically, both the first 200 and second 202 oxide film layers are a SiO2 material.

FUNCTIONAL DESCRIPTION

The present invention TFT combines the use of high temperature thermal oxidation with solid-phase-crystallized poly-Si material. Thermal oxidation requires temperatures in the range of 900–1500° C., that are not compatible with traditional flexible substrates. However, this problem is solved in the present invention by utilizing flexible thin metal foils.

The combination of thermal oxidation with SPC has two distinct benefits:

1) a gate insulator film of excellent bulk and interface quality can be formed; and,
2) the quality of the poly-Si film itself, is improved by effectively annealing out defects in the poly-Si grains.

As a result of these benefits, the devices made with the present invention process combine the feature of very high mobility, with a low threshold voltage and very steep subthreshold swing. When the metal foil itself is sufficiently thin, less than 200 µm, it can be bent or rolled easily. Systems fabricated on such thin foils are robust and yet "flexible" as defined above. In this context, a flexible microsystem can consist of a display only, a display with driving electronics, a display with driving electronics and sensing electronics, or a non-display system, such as a sensor array or a flexible storage (memory) microsystem that can be a stand-alone unit, or one that has the ability to attach to another system for input/output operations.

One aspect of the invention is the combination of a thin metal foil substrate, such as 304 SS, Kovar alloy, Inconel alloy, Ti, or equivalent metals, with the solid-phase crystallization of Si film, having a thickness of 500–1500 Å, in the range of 600–900° C. One other aspect of the process sequence includes a planarization step performed on the as received metal foil substrate, prior to metal deposition. This process is important if the surface roughness of the as-formed metal foil is significant enough to cause yield loss.

A thermal oxidation follows with a temperature in the range of 950–1200° C., to thermally grow a SiO2 gate insulator film with thickness in the range of 100–1000 Å. A variation to the process sequence involves thermal growth of a thin gate insulator layer, for example 200–300 Å, followed by deposition of SiO2 gate insulator by a different method, for example, plasma-enhanced chemical vapor deposition (PECVD) up to a total, combined thickness of approximately 1000 Å. This variation expedites process throughput in some circumstances.

Figure 3:
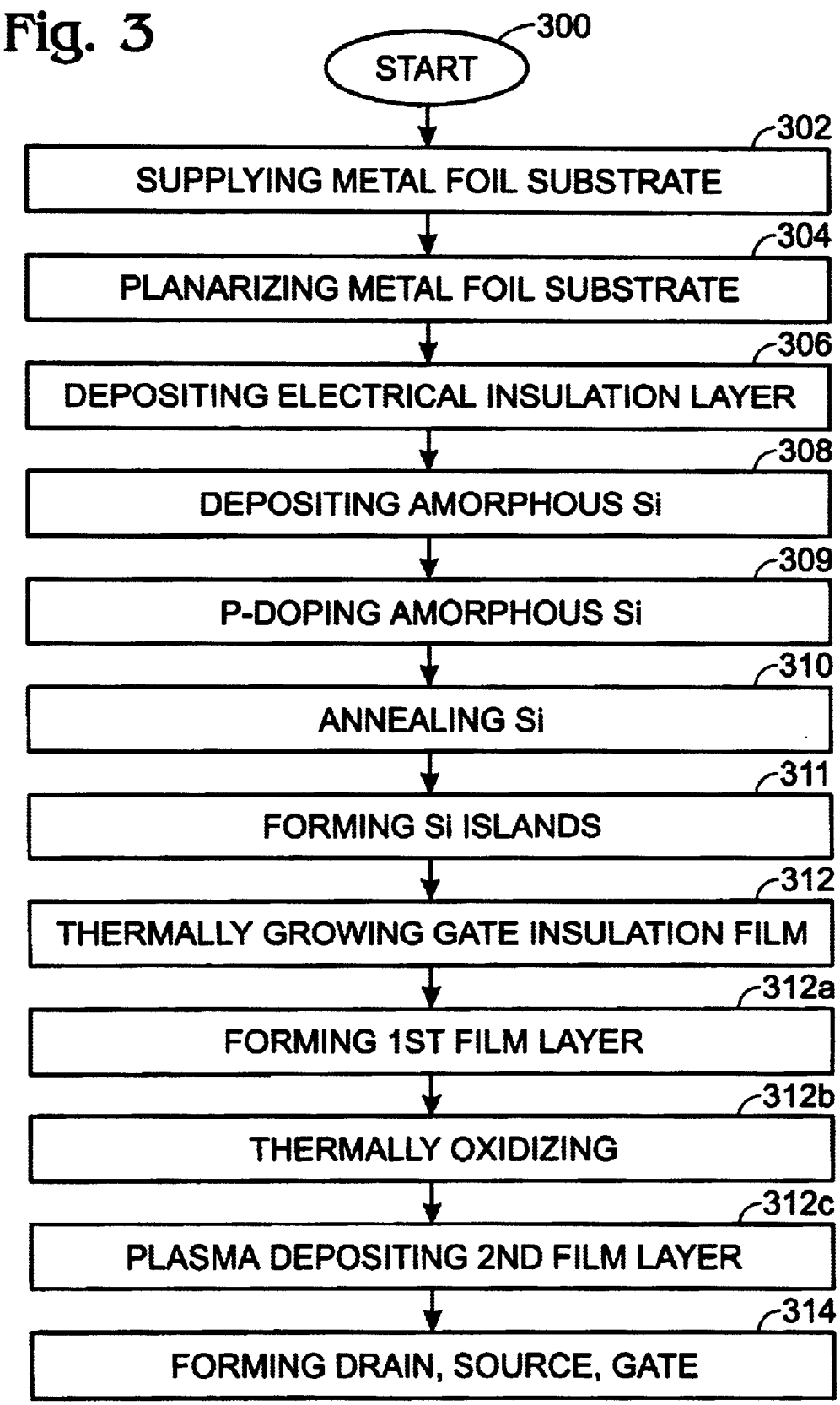
FIG. 3 is a flowchart illustrating the present invention method for forming a thin-film transistor (TFT) on a flexible substrate.

FIG. 3 is a flowchart illustrating the present invention method for forming a thin-film transistor (TFT) on a flexible substrate. Although this method is depicted as a sequence of numbered steps for clarity, no order should be inferred from the numbering unless explicitly stated. It should be understood that some of these steps may be skipped, performed in parallel, or performed without the requirement of maintaining a strict order of sequence. The methods start at Step 300. Step 302 supplies a metal foil substrate with a surface. Step 304 planarizes the metal foil substrate surface. Step 306 deposits an electrical isolation layer overlying the planarized metal foil substrate surface. Step 308 deposits amorphous silicon overlying the electrical insulation layer. Step 310 anneals the amorphous silicon to form polycrystalline silicon. Step 312 thermally grows a gate insulation film overlying the polycrystalline film. Step 314 forms transistor gate, source, and drain regions.

In some aspects of the method, annealing the amorphous silicon to form polycrystalline silicon in Step 310 includes annealing at a temperature greater than 700 degrees C. In some aspects, Step 310 includes using a solid-phase crystallization (SPC) annealing process. Using a SPC annealing process in the annealing Step 310 includes using a process such as furnace or rapid-thermal annealing (RTA). Then, Step 310 includes annealing at a temperature in the range of 700 to 1000 degrees C. for a period of time in the range of 2 seconds to 30 minutes. Preferably, Step 310 includes annealing at a temperature in the range of 750 to 950 degrees C. for a period of time in the range of 2 seconds to 30 minutes.

Alternately in other aspects, annealing the amorphous silicon to form polycrystalline silicon in Step 310 includes using a Laser-Induced Lateral Growth (LILaC) annealing process. While either annealing process can be used, the SPC annealing is more likely to expedite the process.

LILAC relies on lateral growth of Si grains using very narrow laser beams, that are generated by passing a laser beam through a beam-shaping mask, and projecting the image of the mask to the film that is being annealed. The initially amorphous silicon film is irradiated by a very narrow laser beamlet, with typical widths of a few microns (i.e. 3–5 μm. Such small beamlets are formed by passing the original laser beam through a mask that has open spaces or apertures, and projecting the beamlets onto the surface of the annealed Si-film. A step-and-repeat approach is used. The shaped laser "beamlet" irradiates the film and then steps by a distance smaller than half of the width of the slit. As a result of this deliberate advancement of each beamlet, grains are allowed to grow laterally from the crystal seeds of the poly-Si material formed in the previous step. This is equivalent to laterally "pulling" the crystals, as in zone-melting-crystallization (ZMR) method or other similar processes. As a result, the crystal tends to attain very high quality along the "pulling" direction, in the direction of the advancing beamlets. This process occurs simultaneously at each slit on the mask, allowing for rapid crystallization of the area covered by the projection of the mask on the substrate. Once this area is crystallized, the substrate moves to a new (unannealed) location and the process is repeated.

In some aspects a further step, Step 311 patterns the silicon to form silicon islands after the annealing process in Step 310. Thermally growing a gate insulation film in Step 312 includes thermally growing a gate insulation layer overlying polycrystalline islands. Alternately, patterning the silicon to form silicon islands in Step 311 occurs prior to annealing of the amorphous silicon in Step 310.

In some aspects, supplying a metal foil substrate with a surface in Step 302 includes supplying a metal foil material such as Ti, Inconel alloy, stainless steel, or Kovar. Step 302 includes supplying a metal foil having a thickness in the range of 10 to 500 microns. Preferably, Step 302 supplies a metal foil having a thickness in the range of 50 to 250 microns. Most preferably, the metal foil has a thickness in the range of 100 to 200 microns.

In some aspects, planarizing the metal foil substrate surface in Step 304 includes chemical-mechanical polishing (CMP) the metal foil substrate surface. Then, Step 304 includes polishing to an average surface roughness of less than approximately 200 nanometers (nm). Alternately, planarizing the metal foil substrate surface in Step 304 includes spin-coating a dielectric material overlying the metal foil substrate surface. In some aspects, spin-coating a dielectric material overlying the metal foil substrate surface includes forming a dielectric layer having a thickness in the range of 200 to 500 nm. In other aspects, spin-coating a dielectric material overlying the metal foil substrate surface includes forming a dielectric layer from a spin-on-glass (SOG) material.

In some aspects of the method, depositing an electrical isolation layer overlying the planarized metal foil substrate surface in Step 306 includes depositing an electrical isolation layer using a material such as SiO2, SiNx, or SiON. In other aspects, the electrical isolation layer is deposited to a thickness in the range of 0.5 to 2 microns. Preferably, the thickness is in the range of 0.5 to 1.5 microns. Most preferably, the thickness is in the range of 0.5 to 1 microns.

In some aspects, depositing amorphous silicon in Step 308 includes depositing amorphous silicon having a thickness in the range of 25 to 150 nm. Preferably, Step 308 includes depositing amorphous silicon having a thickness in the range of 25 to 100 nm. Most preferably, Step 308 includes depositing amorphous silicon having a thickness in the range of 35 to 60 nm.

In some aspects a further step, Step 309, following the deposition of the amorphous silicon in Step 308, p-dopes the amorphous silicon to adjust the threshold voltage.

In some aspects, thermally growing a gate insulation film in Step 312 includes substeps. Step 312a forms a first film polycrystalline silicon layer. Step 312b thermally oxidizes the first film layer. In other aspects, thermally oxidizing the first film layer in Step 312b includes annealing at temperature in the range of 900 to 1150 degrees C. for a period of time in the range of 2 to 60 minutes. In some aspects, forming a first film polycrystalline silicon layer in Step 312a includes forming a first film layer having a thickness in the range of 10 to 100 nanometers (nm).

Alternately, thermally growing a gate insulation film in Step 312 includes an additional substep, Step 312c, of plasma depositing a second layer of oxide overlying the first film. Then, forming a first film layer in Step 312a includes depositing a first film layer having a thickness in the range of 10 to 50 nm. Preferably, the first film layer has a thickness in the range of 20 to 30 nm. Plasma depositing a second layer of oxide overlying the first film in Step 312c then includes depositing a layer having a thickness in the range of 40 to 100 nm. Preferably, the second layer of oxide has a thickness in the range of 50 to 70 nm. In some aspects, plasma depositing a second layer of oxide overlying the first film in Step 312c includes depositing a TEOS-SiO2 material.

A TFT formed on metal foil substrate, with a SPC polysilicon layer, and a thermally oxidized gate insulation layer has been provided. A process to fabricate the above-mention TFT has also been provided. Examples have been provided of some material thicknesses and process temperatures, but the present invention is not necessarily limited to just these examples. Other variations and embodiments of the invention will occur to those skilled in the art.

We claim:

1. A method for forming a thin-film transistor (TFT) on a flexible substrate, the method comprising:
   supplying a metal foil substrate with a surface;
   depositing amorphous silicon;
   annealing the amorphous silicon to form polycrystalline silicon; and,
   thermally growing a gate insulation film overlying the polycrystalline film.

2. The method of claim 1 wherein annealing the amorphous silicon to form polycrystalline silicon includes annealing at a temperature greater than 700 degrees C.

3. The method of claim 2 wherein annealing the amorphous silicon to form polycrystalline silicon includes using a solid-phase crystallization (SPC) annealing process.

4. The method of claim 1 wherein annealing the amorphous silicon to form polycrystalline silicon includes using a Laser-Induced Lateral Growth (LILaC) annealing process.

5. The method of claim 1 further comprising:
   planarizing the metal foil substrate surface;
   depositing an electrical isolation layer overlying the planarized metal foil substrate surface; and,
   wherein depositing amorphous silicon includes depositing amorphous film overlying the electrical insulation layer.

6. The method of claim 5 further comprising:
   patterning the silicon to form silicon islands; and,
   wherein thermally growing a gate insulation film includes thermally growing a gate insulation layer overlying polycrystalline islands.

7. The method of claim 6 further comprising:
   forming transistor gate, source, and drain regions.

8. The method of claim 1 wherein supplying a metal foil substrate with a surface includes supplying a metal foil material selected from the group including titanium (Ti), Inconel alloy, stainless steel, and Kovar.

9. The method of claim 8 wherein supplying a metal foil substrate with a surface includes supplying a metal foil having a thickness in the range of 10 to 500 microns.

10. The method of claim 9 wherein supplying a metal foil substrate with a surface includes supplying a metal foil having a thickness in the range of 50 to 250 microns.

11. The method of claim 10 wherein supplying a metal foil substrate with a surface includes supplying a metal foil having a thickness in the range of 100 to 200 microns.

12. The method of claim 5 wherein planarizing the metal foil substrate surface includes chemical-mechanical polishing (CMP) the metal foil substrate surface.

13. The method of claim 12 wherein chemical-mechanically polishing the metal foil substrate surface includes polishing to an average surface roughness of less than approximately 200 nanometers (nm).

14. The method of claim 5 wherein planarizing the metal foil substrate surface includes spin-coating a dielectric material overlying the metal foil substrate surface.

15. The method of claim 14 wherein spin-coating a dielectric material overlying the metal foil substrate surface includes forming a dielectric layer having a thickness in the range of 200 to 500 nm.

16. The method of claim 14 wherein spin-coating a dielectric material overlying the metal foil substrate surface includes forming a dielectric layer from a spin-on-glass (SOG) material.

17. The method of claim 5 wherein depositing an electrical isolation layer overlying the planarized metal foil substrate surface includes depositing an electrical isolation layer from a material selected from the group including SiO2, SiNx, and SiON.

18. The method of claim 17 wherein depositing an electrical isolation layer overlying the planarized metal foil substrate surface includes depositing a layer having a thickness in the range of 0.5 to 2 microns.

19. The method of claim 18 wherein depositing an electrical isolation layer overlying the planarized metal foil substrate surface includes depositing a layer having a thickness in the range of 0.5 to 1.5 microns.

20. The method of claim 19 wherein depositing an electrical isolation layer overlying the planarized metal foil substrate surface includes depositing a layer having a thickness in the range of 0.5 to 1 microns.

21. The method of claim 1 further comprising:
   following the deposition of the amorphous silicon, p-doping the amorphous silicon to adjust the threshold voltage.

22. The method of claim 3 wherein using a SPC annealing process includes using a process selected from the group including furnace and rapid-thermal annealing (RTA).

23. The method of claim 22 wherein annealing the amorphous silicon at a temperature greater than 700 degrees C. includes annealing at a temperature in the range of 700 to 1000 degrees C. for a period of time in the range of 2 seconds to 30 minutes.

24. The method of claim 23 wherein annealing the amorphous silicon at a temperature greater than 700 degrees C. includes annealing at a temperature in the range of 750 to 950 degrees C. for a period of time in the range of 2 seconds to 30 minutes.

25. The method of claim 1 wherein thermally growing a gate insulation film includes:
   forming a first film polycrystalline silicon layer; and,
   thermally oxidizing the first film layer.

26. The method of claim 25 wherein thermally oxidizing the first film layer includes annealing at temperature in the range of 900 to 1150 degrees C. for a period of time in the range of 2 to 60 minutes.

27. The method of claim 26 wherein forming a first film polycrystalline silicon layer includes forming a first film layer having a thickness in the range of 10 to 100 nanometers (nm).

28. The method of claim 25 wherein thermally growing a gate insulation film further includes plasma depositing a second layer of oxide overlying the first film.

29. The method of claim 28 wherein forming a first film layer includes depositing a first film layer having a thickness in the range of 10 to 50 nm.

30. The method of claim 29 wherein depositing a first film layer includes depositing a layer having a thickness in the range of 20 to 30 nm.

31. The method of claim 29 wherein plasma depositing a second layer of oxide overlying the first film includes depositing a layer having a thickness in the range of 40 to 100 nm.

32. The method of claim 31 wherein plasma depositing a second layer of oxide overlying the first film includes depositing a layer having a thickness in the range of 50 to 70 nm.

33. The method of claim 28 wherein plasma depositing a second layer of oxide overlying the first film includes depositing a TEOS-SiO2 material.

34. The method of claim 6 wherein patterning the silicon to form silicon islands includes patterning polycrystalline islands following the annealing of the amorphous silicon.

35. The method of claim 6 wherein patterning the silicon to form silicon islands includes patterning amorphous silicon islands prior to annealing of the amorphous silicon.

36. The method of claim 1 wherein depositing amorphous silicon includes depositing amorphous silicon having a thickness in the range of 25 to 150 nm.

37. The method of claim 36 wherein depositing amorphous silicon includes depositing amorphous silicon having a thickness in the range of 25 to 100 nm.

38. The method of claim 37 wherein depositing amorphous silicon includes depositing amorphous silicon having a thickness in the range of 35 to 60 nm.

39. A method for forming a thin-film transistor (TFT) on a flexible substrate, the method comprising:

supplying a metal foil substrate with a surface;

planarizing the metal foil substrate surface;

depositing an electrical isolation layer overlying the planarized metal foil substrate surface; depositing amorphous silicon overlying the electrical isolation layer;

annealing the amorphous silicon at a temperature greater than 700 degrees C. to form polycrystalline silicon; and, thermally growing a gate insulation film.

* * * * *